(12) United States Patent
Liu et al.

(10) Patent No.: US 6,221,758 B1
(45) Date of Patent: Apr. 24, 2001

(54) EFFECTIVE DIFFUSION BARRIER PROCESS AND DEVICE MANUFACTURED THEREBY

(75) Inventors: Chung-Shi Liu; Shau-Lin Shue; Chen-Hua Yu, all of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/225,064

(22) Filed: Jan. 4, 1999

(51) Int. Cl.[7] ................................................. H01L 21/4763
(52) U.S. Cl. ........................ 438/626; 438/687; 438/685; 438/627; 438/640; 438/648; 438/643
(58) Field of Search ..................................... 438/626–629, 438/633, 637–641, 643–644, 648, 668, 672, 675, 685, 687

(56) References Cited

U.S. PATENT DOCUMENTS

| | | | |
|---|---|---|---|
| 4,931,410 | 6/1990 | Tokunaga et al. | 437/189 |
| 5,326,404 | * 7/1994 | Sato | 118/723 MR |
| 5,668,054 | 9/1997 | Sun et al. | 438/653 |
| 5,674,787 | 10/1997 | Zhao et al. | 437/230 |
| 5,714,418 | 2/1998 | Bai et al. | 438/627 |
| 5,893,752 | * 4/1999 | Zhang et al. | 438/687 |
| 6,057,231 | * 5/2000 | Givens et al. | 438/644 |

* cited by examiner

*Primary Examiner*—Charles Bowers
*Assistant Examiner*—Thanh Nguyen
(74) *Attorney, Agent, or Firm*—George O. Saile; Stephen B. Ackerman; Graham S. Jones, II

(57) ABSTRACT

In forming a semiconductor device in which an electrically conductive substrate is covered with a dielectric layer by the following steps, form a trench with a trench line on top and a contact hole on the bottom in the dielectric layer with the overall trench reaching down to the substrate. Preclean the trench. Form a tantalum film over the dielectric layer including the trench walls, covering the exposed the substrate surface. Fill grain boundaries of the tantalum film with at least one of tantalum oxide and tantalum nitride forming a filled tantalum film. Form a redeposited tantalum layer above the filled tantalum film. Form a copper seed film above the redeposited tantalum film. Plate the device filling the trench with a plated bulk copper layer on the seed film. Planarize the device to expose the top surface of the dielectric layer, removing surplus portions of the filled tantalum film, the copper seed film, and the bulk copper layer. The filled tantalum film is formed by exposing the tantalum to air under STP atmospheric conditions or by exposure to a nitrous oxide ($N_2O$) gas in a plasma at a temperature of about 400° C.

11 Claims, 3 Drawing Sheets

EFFECTIVE DIFFUSION BARRIER PROCESS AND DEVICE MANUFACTURED THEREBY

BACKGROUND OF THE INVENTION

1. Field of the Invention

This invention relates to semiconductor devices and more particularly to diffusion barriers for conductors.

2. Description of Related Art

U.S. Pat. No. 5,714,418 of Bai et al. for "Diffusion Barrier for Electrical Interconnects in an Integrated Circuit" discloses a bi-layer barrier for a copper interconnect using titanium/tantalum (Ti/Ta) or tantalum nitride (TaN).

U.S. Pat. No. 5,668,054 of Sun et al. for "Process for Fabricating Tantalum Nitride Diffusion Barrier for Copper Metallization" shows a tantalum nitride (TaN) diffusing barrier for a copper interconnect.

U.S. Pat. No. 4,931,410 of Tokunaga et al. for "Process for Producing Semiconductor Integrated Circuit Device Having Copper Interconnections and/or Wirings, and Device Produced" shows a copper (Cu) wire interconnect process.

U.S. Pat. No. 5,674,787 of Zhoa et al. for "Selective Electroless Copper Deposited Interconnect Plugs for ULSI Applications" mentions a tantalum barrier for a copper interconnect. See col. 5.

SUMMARY OF THE INVENTION

This invention provides a Ta barrier layer and filling/stuffing process for a Cu interconnect process.

Before deposition of a copper interconnect conductor tantalum (Ta) is deposited. Next the initial tantalum film is filled, i.e. stuffed with an oxide and/or a nitride to form an enhanced tantalum (Ta) barrier layer by exposure to room temperature atmospheric air or exposure to a nitrous oxide ($N_2O$) gas in a plasma to improve barrier properties. This improves the barrier properties of the tantalum (Ta) by the oxygen ($O_2$) gas or $N_2O$ to fill or stuff the grain boundaries of the tantalum metal film. The tantalum film can be filled with oxygen and/or nitrogen preferably at about 600° C. or in a plasma at a lower temperature of about 400° C. The filled tantalum film can be formed by exposure to a nitrous oxide ($N_2O$) gas in a plasma at a temperature of about 400° C. Next, the filled tantalum film is coated with a redeposited tantalum layer. This simultaneously avoids degrading of the adhesion between the tantalum (Ta) the copper (Cu) layers which are added on top of the refilled tantalum layer.

In accordance with this invention, a method is provided for forming a semiconductor device in which an electrically conductive substrate is covered with a dielectric layer by the following steps. Form a trench in the dielectric layer reaching down to expose a portion of the substrate, the trench having walls. The trench is precleaned prior to forming the tantalum film. Form a tantalum film superjacent to the dielectric layer including the walls and covering the portion of the substrate. Fill the tantalum film by oxidizing to form at least one of tantalum oxide and tantalum nitride forming a filled tantalum film. After filling the tantalum film a redeposited tantalum layer is formed superjacent to the filled tantalum film. Form a copper seed film superjacent to the redeposited tantalum film. Plate the device filling the trench with a plated bulk copper layer superjacent to the copper seed film. Planarize the device to expose the top surface of the dielectric layer, removing surplus portions of the filled tantalum film, the copper seed film, and the bulk copper layer. Preferably, the filled tantalum film is formed by exposing the tantalum to air under STP atmospheric conditions; or the filled tantalum film is formed by exposure to a nitrous oxide ($N_2O$) gas in a plasma at a temperature of about 600° C.

In accordance with another aspect of this invention, a semiconductor device has an electrically conductive substrate is covered with a dielectric layer with a trench formed therein reaching down to expose a portion of the substrate. The trench was precleaned prior to forming a tantalum film which is over the dielectric layer including the walls and covering the portion of the substrate. The tantalum film has grain boundaries filled with at least one of tantalum oxide and tantalum nitride forming a filled tantalum film. There are a redeposited tantalum layer over the filled tantalum film and a copper seed film over the redeposited tantalum film. The trench is filled with a plated bulk copper layer over the copper seed film, and the device is planarized to expose the top surface of the dielectric layer, after removal of surplus portions of the filled tantalum film, the copper seed film, and the bulk copper layer. Preferably, the filled tantalum film was exposed to air under STP atmospheric conditions or to a nitrous oxide ($N_2O$) gas in a plasma at a temperature of about 600° C.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
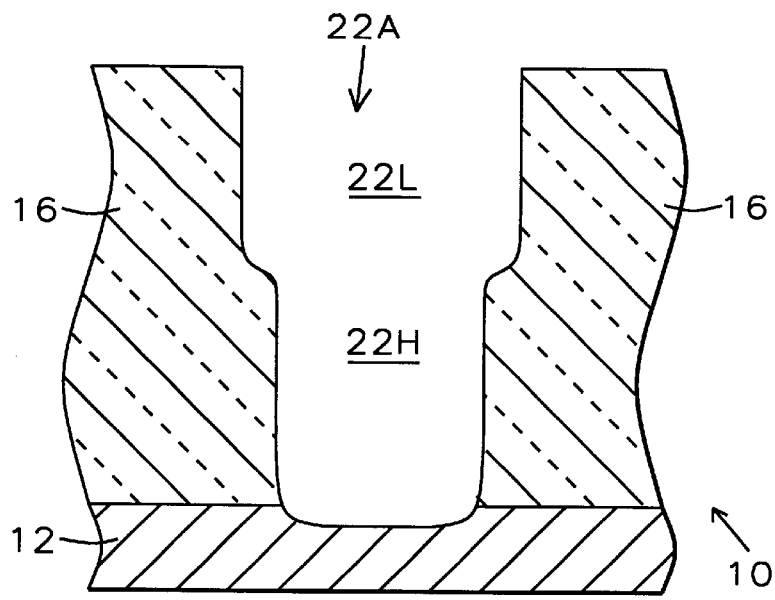
FIGS. 1A–1E show a sectional view of a portion of a semiconductor device in accordance with this invention being manufactured in accordance with this invention.

FIG. 1A shows a sectional view of a portion of a semiconductor device 10 with a substrate 12 formed of a silicide of (Ta, W, Ti, etc.) or a metal layer. Above the substrate layer 12, an InterLevel Dielectric (ILD) or Inter Metal Dielectric (IMD) dielectric layer 16 has been formed and a dual damascene trench 22A including a space for a trench line 22L and a contact hole 22H (via hole) has been formed, preferably by etching photolithographically (with a photoresist mask which has been stripped away) in the top surface of the dielectric layer 16. The dual damascene trench 22A extends down through trench line 22L and contact hole 22H until trench 22A reaches down to the top surface of the substrate 12 of silicide or metal removing a modest amount of the surface of layer 12 in the process of forming the hole 22A by etching or otherwise.

Figure 1B:
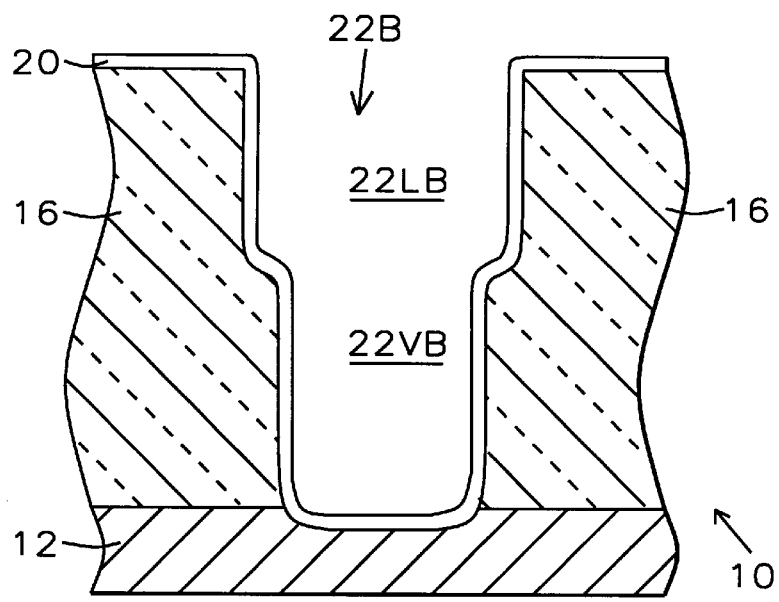

FIG. 1B shows the device 10 of FIG. 1A after precleaning the device by Argon sputtering, followed by formation of a thin tantalum barrier film 20, superjacent to device 10 forming a narrower and shallower trench 22B by covering the surface of dielectric layer 16, as well as the sidewalls of trench 22A in FIG. 1A and the exposed surface of substrate 12 at the bottom of trench 22A within the barrier layer 20. Film 20 has a thickness from about 20 Å to about 500 Å and film 20 is deposited by a process such as PVD (Physical Vapor Deposition). Trench line 22L and contact hole 22H have been reduced by the thickness of film 20 to comprise trench line 22LB and contact hole 22VB.

Figure 1C:
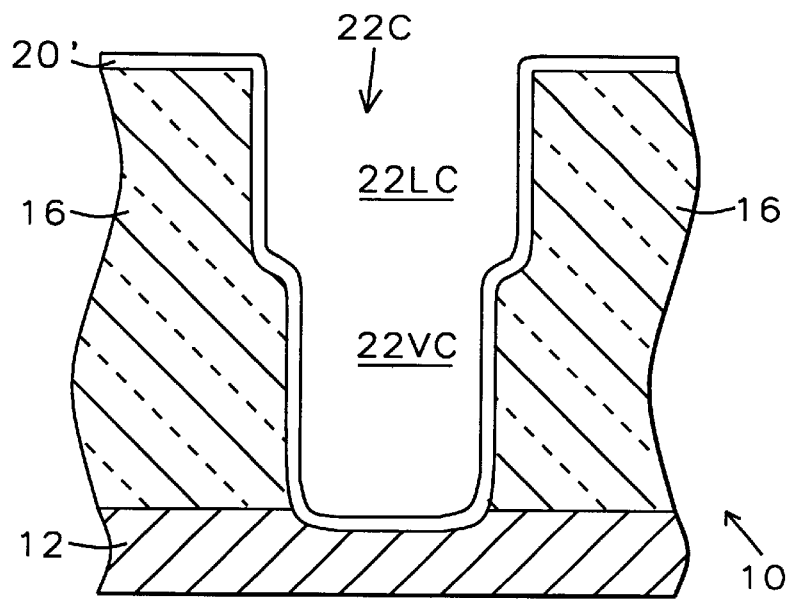

FIG. 1C shows the device 10 of FIG. 1B after exposure of the device 10 to air to cause oxygen gas ($O_2$) to fill, i.e. stuff, the tantalum film 20 in trench 22B and elsewhere to form a stuffed/oxidized tantalum film 20' lining the trench 22C formed from trench 22B. The stuffing occurs at STP (Room temperature and atmospheric pressure). Alternatively, the tantalum film 20' is stuffed with oxygen and/or nitrogen preferably at about 600° C. or in a plasma at a lower temperature of about 400° C. For example, the filled tantalum film can be formed by exposure to a nitrous oxide ($N_2O$) gas in a plasma at a temperature of about 400° C. During the stuffing process, the grain boundaries or interstices in the tantalum film 20' are filled with atoms of the stuffing oxygen which forms tantalum oxide which fills the grain boundaries/interstices of the tantalum metal lattice structure with tantalum oxide and additional tantalum oxide is formed on the surface of tantalum film 20. Since the stuffed gas simply fills the interstices in the film 20', the dimensions of the trench 22C are substantially the same as the trench 22B of FIG. 1B. See Sinke et al., Appl. Phys. Lett., Vol. 47, No. 5 (1985) p. 471 et seq. Trench line 22LB and contact hole 22VB have been replaced by the trench line 22LC and contact hole 22VC with the dimensions of the corresponding portions of trench hole 22C.

Figure 1D:
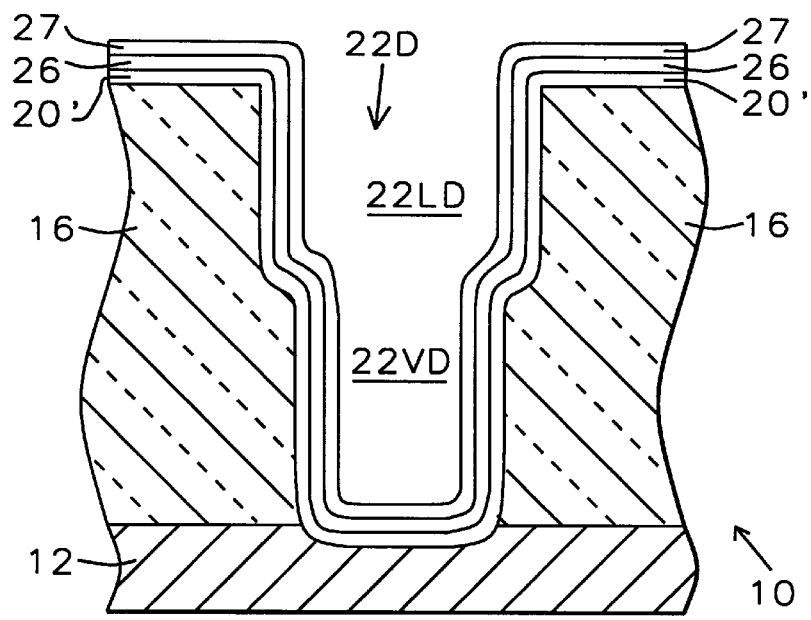

FIG. 1D shows the device 10 of FIG. 1C after trench 22C has been filled with a redeposited tantalum layer 26 formed over stuffed tantalum film 20' and a copper seed film 27 formed over the redeposited tantalum layer 26 which leaves a shallower and narrower trench 22D when compared with trench 22C in FIG. 1C. The redeposited tantalum layer 26 is formed to improve the adhesion/barrier functions of the stuffed tantalum film 20'. The copper seed film 27 is provided to enhance plating of copper in the next step shown in FIG. 1E. Trench line 22LC and contact hole 22VC have been reduced by the thickness of films 26 and 27 to comprise trench line 22LD and contact hole 22VD.

Tantalum layer 26 has a thickness from about 20 Å to about 500 Å; and tantalum layer 26 is deposited by a process such as PVD.

Copper seed film 27 has a thickness from about 500 Å to about 2,500 Å and copper seed film 27 is deposited by a process such as CVD, LPCVD, PECVD, evaporation, or PVD.

Figure 1E:
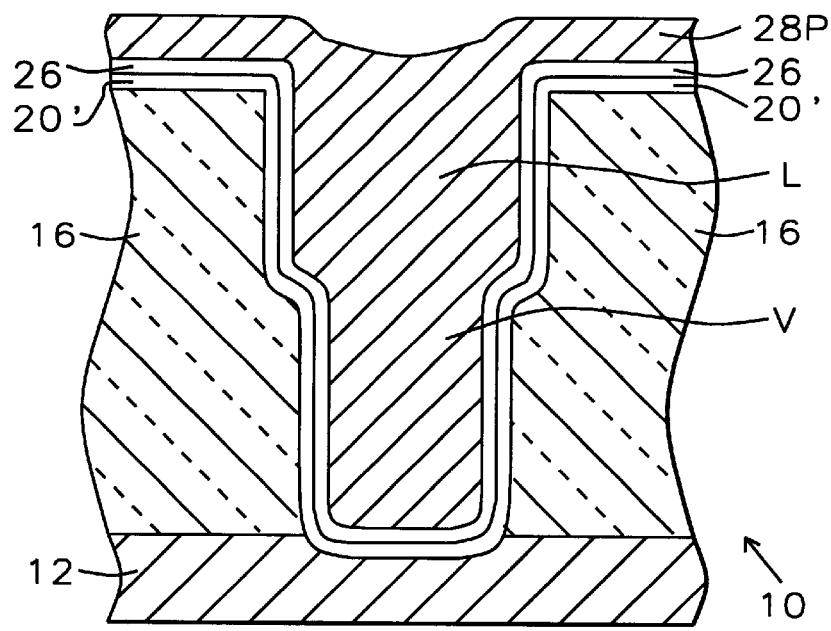

FIG. 1E shows the device 10 of FIG. 1D after a process of plating by ECD (ElectroChemical Deposition)

The result of the plating step is overplating of the trench 22D in FIG. 1D with copper layer 28P. The seed film 27 has been merged with the bulk copper layer 28P and is no longer shown in the drawings for that reason.

The layer 28P can be deposited by another process such as electroless plating, CVD or PVD (high temperature with reflow, as is done with a conventional hot-Al process.)

The result is that the copper plug or interconnect line 28 connects to the silicide or metal layer.

Figure 1F:
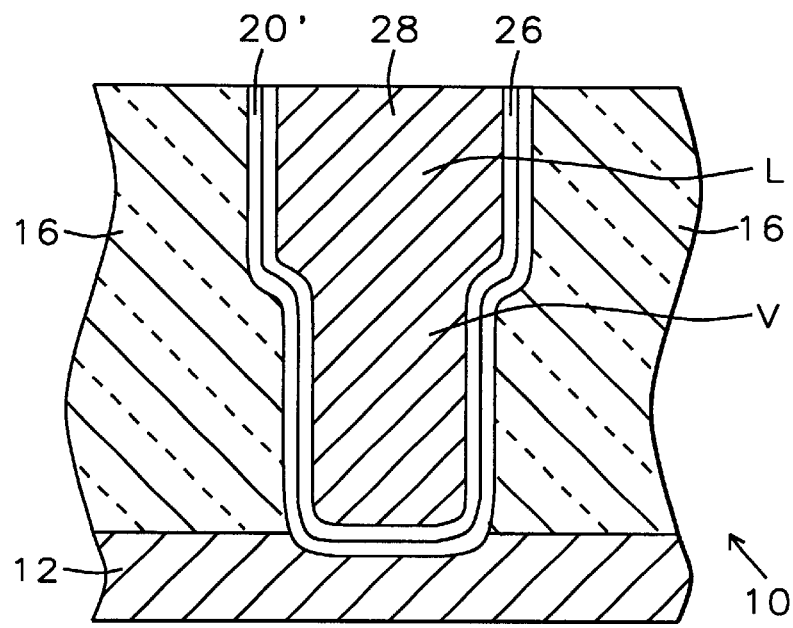
FIG. 1F shows the device of FIG. 1E after a process of CMP which smooths the surface of the device so that copper in the layer is flush with the surface of the dielectric layer.

FIG. 1F shows the device 10 of FIG. 1E after a process of CMP (Chemical Mechanical Polishing or Planarization) which smooths the surface of device 10 so that the copper layer 28 in the trench 22D is flush with the surface of the ILD/IMD layer 16 as well as the layers 20'/26 after removal of the layer 28P of FIG. 1E.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of forming a semiconductor device in which an electrically conductive substrate is covered with a dielectric layer comprising:

forming a trench for a dual damascene structure comprising a trench line space and a contact hole in said dielectric layer, said trench reaching down to expose a portion of said substrate, said trench having walls, then precleaning said trench with argon sputtering, forming a tantalum metal film superjacent to said dielectric layer including said walls and covering said portion of said substrate, filling grain boundaries of said tantalum metal film with at least one of tantalum oxide and tantalum nitride forming a filled tantalum film to form a stuffed tantalum film filling grain boundaries/interstices with additional tantalum oxide formed on the surface of the tantalum film, forming a copper seed film above said stuffed tantalum metal film, plating said device filling said trench with a plated bulk copper layer superjacent to said copper seed film, and planarizing said device to expose the top surface of said dielectric layer, removing surplus portions of said filled tantalum film, said copper seed film, and said bulk copper layer.

2. A method in accordance with claim 1 wherein:
said filled tantalum film is formed by exposing said tantalum to air under STP atmospheric conditions.

3. A method in accordance with claim 1 wherein:
said filled tantalum film is formed by exposure to a nitrous oxide ($N_2O$) gas in a plasma at a temperature of about 400° C.

4. A method in accordance with claim 1 wherein:
after filling said tantalum film, form a redeposited tantalum layer superjacent to said filled tantalum film.

5. A method in accordance with claim 1 wherein:
said filled tantalum film is formed by exposing said tantalum to air under STP atmospheric conditions, and
after filling said tantalum film, form a redeposited tantalum layer superjacent to said filled tantalum film.

6. A method in accordance with claim 1 wherein:
said filled tantalum film is formed by exposure to a nitrous oxide (N2O) gas in a plasma at a temperature of about 400° C., and
after filling said tantalum film, form a redeposited tantalum layer superjacent to said filled tantalum film.

7. A method of forming a semiconductor device in which an electrically conductive substrate is covered with a dielectric layer comprising:

forming a trench for a dual damascene structure comprising a trench line space and a contact hole in said dielectric layer, said trench reaching down to expose a portion of said substrate, said trench having walls, then precleaning said trench by argon sputtering, forming a tantalum metal film superjacent to said dielectric layer including said walls and covering said portion of said substrate, filling grain boundaries of said tantalum metal film with at least one of tantalum oxide and tantalum nitride forming a stuffed tantalum metal film, after filling said tantalum film, forming a redeposited tantalum layer superjacent to said stuffed tantalum film, forming a copper seed film above said filled tantalum film, plating said device filling said trench with a plated bulk copper layer superjacent to said copper seed film, planarizing said device to expose the top surface of said dielectric layer, removing surplus portions of said filled tantalum film, said copper seed film, and said bulk copper layer.

8. A method of forming a semiconductor device in which an electrically conductive substrate is covered with a dielectric layer comprising:

forming a trench in said dielectric layer comprising a dual damascene structure with a trench line space stacked above a contact hole in said dielectric layer, said trench reaching down to expose a portion of said substrate, said trench having walls, said trench is precleaned with argon sputtering prior to forming said tantalum film, forming a tantalum metal film superjacent to said dielectric layer including said walls and covering said portion of said substrate having a thickness from about 20 Å to about 500 Å, filling grain boundaries of said tantalum metal film with at least one of tantalum oxide and tantalum nitride forming a stuffed tantalum film, after filling said tantalum film, forming a redeposited tantalum layer superjacent to said stuffed tantalum metal film, forming a copper seed film superjacent to said redeposited tantalum film, plating said device filling said trench with a plated bulk copper layer superjacent to said copper seed film, and planarizing said device to expose the top surface of said dielectric layer, removing surplus portions of said filled tantalum film, said copper seed film, and said bulk copper layer.

9. A method in accordance with claim 8 wherein:

said filled tantalum film is formed by exposing said tantalum to air under STP atmospheric conditions.

10. A method in accordance with claim 8 wherein:

said filled tantalum film is formed by exposure to a nitrous oxide ($N_2O$) gas in a plasma at a temperature of about 400° C.

11. A method of forming a semiconductor device with a dielectric layer formed over an electrically conductive substrate comprising:

forming a trench for a dual damascene structure comprising a trench line space and a contact hole in said dielectric layer, said trench reaching down to expose a portion of said substrate, said trench having walls, then precleaning said trench with argon sputtering, then forming a tantalum metal film superjacent to said dielectric layer including said walls and covering said portion of said substrate, then forming a stuffed tantalum film by filling grain boundaries of said tantalum metal film with at least one of tantalum oxide and tantalum nitride, said filled tantalum metal film being formed by exposure to a nitrous oxide ($N_2O$) gas in a plasma at a temperature of about 400° C., and after filling said tantalum metal film, forming a redeposited tantalum layer superjacent to said stuffed tantalum film, forming a copper seed film above said stuffed tantalum film, plating said device filling said trench with a plated bulk copper layer superjacent to said copper seed film, planarizing said device to expose the top surface of said dielectric layer, removing surplus portions of said filled tantalum film, said copper seed film, and said bulk copper layer.

\* \* \* \* \*